United States Patent
Muta

(10) Patent No.: US 8,786,091 B2
(45) Date of Patent: Jul. 22, 2014

(54) SEMICONDUCTOR APPARATUS HAVING A HIGH-ASPECT PENETRATING ELECTRODE AND MANUFACTURING METHOD THEREOF

(75) Inventor: Tadayoshi Muta, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 13/059,720

(22) PCT Filed: Oct. 19, 2009

(86) PCT No.: PCT/JP2009/068298
§ 371 (c)(1),
(2), (4) Date: Feb. 18, 2011

(87) PCT Pub. No.: WO2010/047402
PCT Pub. Date: Apr. 29, 2010

(65) Prior Publication Data
US 2011/0147941 A1 Jun. 23, 2011

(30) Foreign Application Priority Data
Oct. 21, 2008 (JP) ................................. 2008-271010
Oct. 9, 2009 (JP) ................................. 2009-235385

(51) Int. Cl.
*H01L 23/532* (2006.01)
*H01L 21/60* (2006.01)

(52) U.S. Cl.
USPC ............ 257/770; 257/E21.507; 257/E23.155; 257/E23.011; 257/741; 257/774; 257/751; 257/621; 438/675

(58) Field of Classification Search
USPC .................. 257/770, 741, 774, 773, E21.507, 257/E23.155, 621, E23.023, E23.011, 257/E31.113, 751
See application file for complete search history.

(56) References Cited

U.S. PATENT DOCUMENTS

| | | | | |
|---|---|---|---|---|
| 5,565,708 | A * | 10/1996 | Ohsaki et al. | 257/764 |
| 6,768,205 | B2 * | 7/2004 | Taniguchi et al. | 257/774 |
| 6,856,023 | B2 * | 2/2005 | Muta et al. | 257/774 |
| 7,646,079 | B2 * | 1/2010 | Umemoto | 257/621 |

(Continued)

FOREIGN PATENT DOCUMENTS

| | | |
|---|---|---|
| JP | A 02-039569 | 2/1990 |
| JP | 9-265186 A | 10/1997 |

(Continued)

OTHER PUBLICATIONS

JPO Office Action issued on Jun. 25, 2013 in counterpart Japanese patent application 2009-235385 (in translation).

*Primary Examiner* — Alexander Oscar Williams
(74) *Attorney, Agent, or Firm* — Fitzpatrick, Cella, Harper & Scinto

(57) ABSTRACT

A semiconductor apparatus with a penetrating electrode having a high aspect ratio is manufactured with a low-temperature process. In one embodiment a first electrode 3 and a second electrode 6 of a semiconductor substrate 1 that are provided at the front and rear surface sides, respectively, are electrically connected by a conductive object 7 filled in a contact hole 4 and an extended portion 6a of the second electrode 6 extends to the contact hole 4. Even though the contact hole 4 has a high aspect ratio, film formation using the low-temperature process is enabled by using the conductive object 7, instead of forming the second electrode 6 on a bottom portion of the contact hole 4.

11 Claims, 5 Drawing Sheets

(56) References Cited

U.S. PATENT DOCUMENTS

| | | | |
|---|---|---|---|
| 2002/0017710 A1* | 2/2002 | Kurashima et al. | 257/686 |
| 2002/0061645 A1* | 5/2002 | Trivedi et al. | 438/640 |
| 2003/0043615 A1* | 3/2003 | Lin | 365/141 |
| 2003/0082356 A1 | 5/2003 | Suemasu et al. | 428/209 |
| 2004/0043615 A1 | 3/2004 | Yamamoto et al. | 438/689 |
| 2005/0194670 A1 | 9/2005 | Kameyama et al. | 257/678 |
| 2005/0205997 A1 | 9/2005 | Yamamoto et al. | 257/751 |
| 2006/0024966 A1* | 2/2006 | Umemoto et al. | 438/689 |
| 2006/0087042 A1 | 4/2006 | Kameyama et al. | 257/774 |
| 2006/0202348 A1* | 9/2006 | Kameyama et al. | 257/774 |
| 2007/0243706 A1* | 10/2007 | Komuro | 438/667 |
| 2008/0128848 A1* | 6/2008 | Suzuki et al. | 257/448 |
| 2008/0252396 A1* | 10/2008 | Ruile et al. | 333/187 |
| 2008/0283951 A1* | 11/2008 | Nabe et al. | 257/433 |
| 2009/0108411 A1* | 4/2009 | Shiraishi et al. | 257/621 |
| 2009/0124078 A1* | 5/2009 | Kameyama et al. | 438/674 |
| 2009/0200679 A1* | 8/2009 | Harada et al. | 257/773 |
| 2009/0243047 A1* | 10/2009 | Wolter et al. | 257/621 |
| 2010/0096749 A1* | 4/2010 | Kim et al. | 257/737 |
| 2010/0127403 A1 | 5/2010 | Muta | 257/774 |
| 2010/0148292 A1* | 6/2010 | Minamio et al. | 257/432 |
| 2010/0155940 A1* | 6/2010 | Kawashita et al. | 257/737 |
| 2011/0006303 A1 | 1/2011 | Muta | 257/48 |
| 2011/0057326 A1* | 3/2011 | Kai et al. | 257/774 |
| 2011/0086486 A1* | 4/2011 | Lee et al. | 438/381 |
| 2011/0133336 A1* | 6/2011 | Tanaka et al. | 257/737 |
| 2011/0133343 A1* | 6/2011 | Wada | 257/774 |
| 2011/0147941 A1* | 6/2011 | Muta | 257/770 |
| 2011/0211609 A1* | 9/2011 | Izu et al. | 372/50.1 |
| 2011/0233773 A1* | 9/2011 | Kawashita et al. | 257/737 |
| 2011/0272806 A1* | 11/2011 | Akram et al. | 257/738 |
| 2012/0021601 A1* | 1/2012 | Pratt et al. | 438/637 |
| 2012/0056322 A1* | 3/2012 | Saigoh et al. | 257/737 |
| 2012/0112361 A1* | 5/2012 | Han et al. | 257/774 |
| 2012/0164825 A1* | 6/2012 | Kim et al. | 438/613 |
| 2012/0189781 A1* | 7/2012 | Sakaki | 427/526 |
| 2012/0220123 A1* | 8/2012 | Nakayama et al. | 438/667 |
| 2012/0228746 A1* | 9/2012 | Nagata | 257/621 |
| 2012/0267763 A1* | 10/2012 | Chumakov | 257/534 |
| 2012/0286387 A1* | 11/2012 | Nabe et al. | 257/433 |
| 2013/0075842 A1* | 3/2013 | Ha et al. | 257/421 |

FOREIGN PATENT DOCUMENTS

| | | |
|---|---|---|
| JP | H09-265186 | 10/1997 |
| JP | 2003-168859 A | 6/2003 |
| JP | 2004-95849 A | 3/2004 |
| JP | A 2005-235859 | 9/2005 |
| JP | 2005-303258 A | 10/2005 |
| JP | 2009-135529 A * | 6/2009 |

* cited by examiner

SEMICONDUCTOR APPARATUS HAVING A HIGH-ASPECT PENETRATING ELECTRODE AND MANUFACTURING METHOD THEREOF

TECHNICAL FIELD

The present invention relates to a semiconductor apparatus that includes a penetrating electrode having a high aspect ratio and not affected by the shape of the hole, and a manufacturing method thereof.

BACKGROUND ART

In recent years, due to decrease in size and improvement in performance of electronic apparatus, it has been required for a semiconductor apparatus to have a small size and a high density (number of components per unit area). For this reason, a semiconductor apparatus is connected on its rear surface to external terminals by means of a penetrating electrode, which makes the front and rear surfaces of the semiconductor substrate electrically conductive. Further, a plurality of semiconductor substrates, each having a rear surface provided with a wiring line, are laminated, and the front and rear surfaces of the individual semiconductor substrates are electrically connected by the penetrating electrodes, thereby increasing the mounting density. Such penetrating electrodes in semiconductor devices are used in semiconductor chips that are used in semiconductor memories, CMOS sensors, AF sensors and the like. Further, penetrating electrodes are used in various fields, such as in semiconductor packages where a plurality of semiconductor chips are laminated, or an inkjet head body.

Further, it is increasingly needed to form the penetrating electrode in a semiconductor substrate that has semiconductor devices formed thereon, or in a semiconductor substrate having previously formed semiconductor devices and whose structure is partially formed of an organic material. In order to prevent the penetrating electrode from affecting the semiconductor device or the structure formed of the organic material, the penetrating electrode needs to be formed with a low-temperature process. However, it is difficult to form a highly reliable penetrating electrode having a high aspect ratio with respect to a contact hole of a complicated hole shape—such as a reverse tapered shape—with a low-temperature process (for example, 200° C. or less) at low cost, which has been a problem necessary to be solved.

For example, in the configuration that is disclosed in U.S. Patent Application Publication No. 2006/0087042, as illustrated in FIG. 5, a second electrode 106 is thinly formed in a bottom portion of a contact hole 104 and is connected to a first electrode 103. Then, the thickness of the second electrode 106 is increased by plating.

However, as in the conventional example, in the structure where the second electrode 106 is connected to the first electrode 103 at the bottom portion of the contact hole 104, it is difficult to form a reliable penetrating electrode with respect to a contact hole having a high aspect ratio or a contact hole having a reverse tapered shape, with the low-temperature process.

Specifically, first, the second electrode 106 is formed in the contact hole from a second surface of the semiconductor substrate at the rear side, and is connected to the first electrode 103. An MO-CVD method (that is, a CVD method using an organic metal) is used to form a thin film to be the second electrode. In the MO-CVD method, the thin film cannot be formed in the semiconductor substrate without heating the semiconductor substrate to a high temperature. For this reason, a penetrating electrode having high reliability cannot be formed with the low-temperature process (for example, 200° C. or less).

Further, a plating film thickness required for the second electrode is deposited by electroplating in the bottom portion of the contact hole as the surface of the first electrode 103 at the rear side and in a corner portion of the bottom portion of the contact hole. At this time, however, the deposition speed of the plating is significantly different in the bottom portion or the corner portion of the contact hole, and in the second surface of the semiconductor substrate at the rear side. This difference in the deposition speed becomes significant as the aspect ratio increases. For example, with an aspect ratio of 5, the ratio of the deposition film thickness of the second electrode 106 at the bottom portion of the contact hole to the deposition film thickness of the second electrode 106 at the second surface of the semiconductor substrate is 0.5:10 to 1:10, and the circuit thickness of the surface of the semiconductor substrate becomes 10 times larger or more than the thickness of the thin film of the bottom portion of the contact hole due to the deposition difference of plating. For this reason, it becomes difficult to decrease the size of the circuit.

Meanwhile, in the case of electroless plating, problems are generated in adhesion and foam formation during the electroless plating. In particular, from a practical viewpoint, bad adhesion is a large problem. As a method that avoids the problem of adhesion, similar to the case of electroplating, the MO-CVD method is also used in the case of electroless plating, which is the only way to avoid this problem. Similar to the case of electroplating, the problem cannot be solved with low-temperature processing, at 200° C. or less.

Further, there is a method for forming the whole of the second electrode using only the MO-CVD method, without using the plating method. However, the problem cannot be solved with low-temperature processing at 200° C. or less, and practical use is difficult.

Accordingly, it is an object of the present invention to provide a semiconductor apparatus where a penetrating electrode having a high aspect ratio can be formed with a low-temperature process, and a manufacturing method thereof.

DISCLOSURE OF THE INVENTION

A semiconductor apparatus according to the present invention includes: a semiconductor substrate; a first electrode provided on a first surface at the front surface side of the semiconductor substrate; a second electrode provided on a second surface at the rear surface side of the semiconductor substrate; a contact hole formed in the semiconductor substrate to penetrate the semiconductor substrate so as to connect the first electrode and the second electrode; and a conductive object filled in the contact hole so as to connect to the first electrode. The second electrode includes an extended portion that extends from the second surface of the semiconductor substrate to the inside of the contact hole, and the extended portion and the conductive object are connected, whereby the first electrode and the second electrode are connected.

A method of manufacturing a semiconductor apparatus according to the present invention includes: forming a first electrode on a first surface at the front surface side of a semiconductor substrate; forming a contact hole in the semiconductor substrate to penetrate the semiconductor substrate; forming a second electrode, having an extended portion extending to the inside of the contact hole, on a second surface at the rear surface side of the semiconductor substrate with a low-temperature process; and filling a conductive object in the contact hole so as to connect the extended portion and the first electrode.

According to the present invention, since the first electrode is connected to the second electrode through the conductive paste filled into the contact hole, a penetrating electrode having a high aspect ratio can be easily and reliably formed using a low-temperature process. Further features of the present invention will become apparent from the following description of exemplary embodiments with reference to the attached drawings.

BEST MODE FOR CARRYING OUT THE INVENTION

The best mode for carrying out the present invention will be described with reference to the accompanying drawings.

Figure 1A:
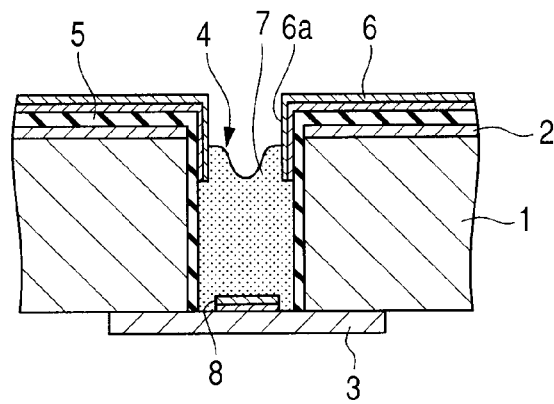
FIGS. 1A, 1B, 1C and 1D are partial cross-sectional views illustrating a main portion of a semiconductor apparatus according to a first embodiment.
Figure 1B:
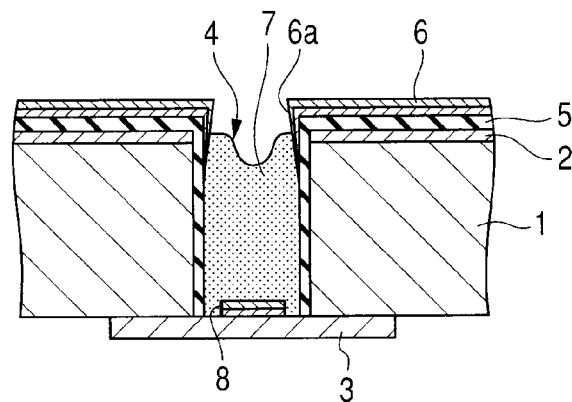
Figure 1C:
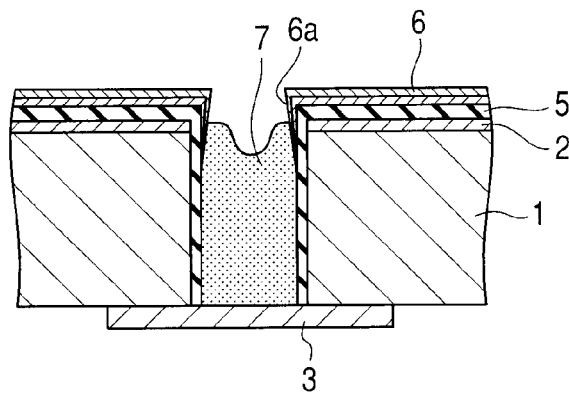
Figure 1D:
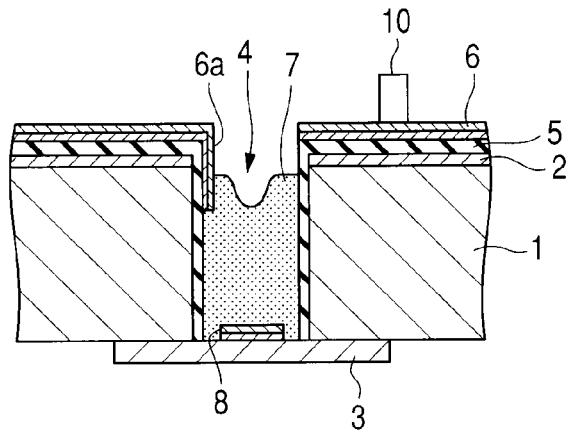
Figure 2A:
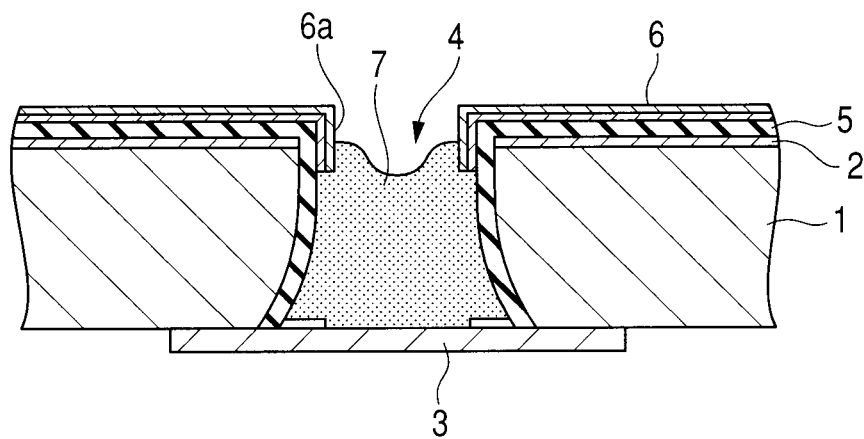
FIGS. 2A and 2B are partial cross-sectional views illustrating the case where contact holes are tapered and inclined.
Figure 2B:
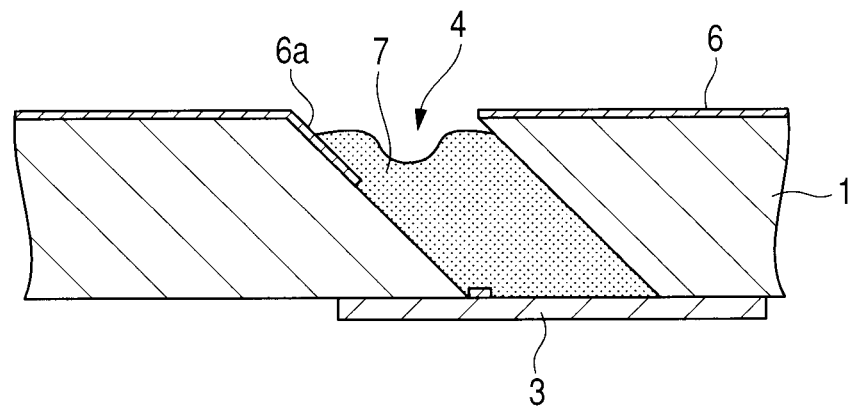
Figure 3A:
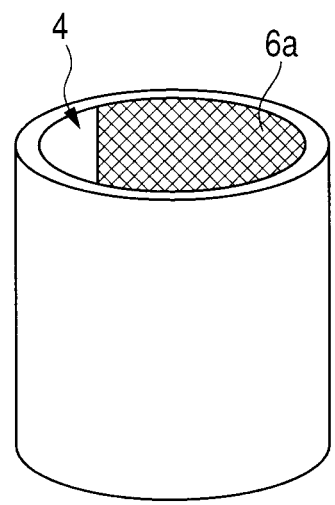
FIGS. 3A, 3B and 3C are diagrams illustrating contact holes having various sectional shapes.
Figure 3B:
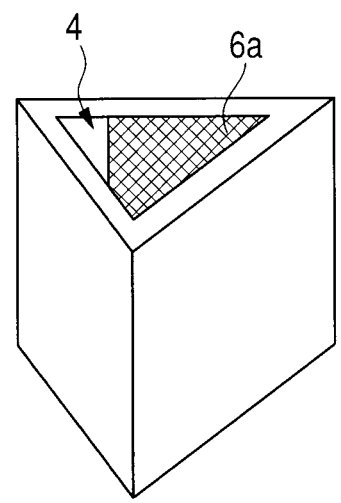
Figure 3C:
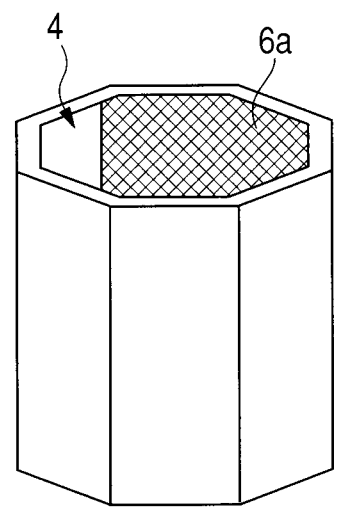

As illustrated in FIG. 1A, a semiconductor substrate 1 includes a passivation film 2, a first electrode 3 that is disposed on a first surface of the downward front surface side in the drawing, a contact hole 4 that penetrates a second surface at the upward rear surface side in the drawing and the semiconductor substrate 1, and a second electrode 6 that is formed on the second surface through an insulating film 5. The first electrode 3 is disposed on a bottom portion of the contact hole 4. The second electrode 6 that is formed of a metal film is formed from the second surface of the semiconductor substrate to an intermediate portion of the side of the contact hole 4. The second electrode 6 is not formed on the bottom portion of the contact hole 4, but on the intermediate portion of the side of the contact hole 4. Here, a portion 6a that is formed on the intermediate portion of the side of the contact hole 4 is called an "extended portion". The second electrode 6 may be formed of a metal film of a single layer or metal films of plural layers. Further, the thickness of the extended portion 6a of the second electrode 6 does not need to be uniform, and may be varied as illustrated in FIG. 1B. On a surface of the first electrode 3, a barrier seed layer 8 is formed to maintain the surface of the first electrode 3 at low resistance. However, as illustrated in FIG. 1C, the barrier seed layer 8 need not be formed. That is, the first electrode can function as a penetrating electrode without causing a problem, even when the barrier seed layer 8 is not formed. A conductive object 7 is filled into the contact hole 4. As a result, the first electrode 3 and the conductive object 7 are connected to each other, and the conductive object 7 and the extended portion 6a of the second electrode 6 are connected to each other. Thereby, the first electrode 3 and the second electrode 6 are electrically connected through the conductive object 7, thereby forming a penetrating electrode. As illustrated in FIG. 1D, if the extended portion 6a of the second electrode 6 is formed in a portion of the contact hole 4 in a circumferential direction, the second electrode functions as the penetrating electrode without causing a problem. By forming the extended portion 6a in the portion of the contact hole 4 in a circumferential direction, the film thickness difference between the second electrode 6 formed on the second surface of the semiconductor substrate and the extended portion 6a formed in the contact hole can be reduced to about ⅓ of what it would conventionally be. Further, a bump 10 may be provided in the second electrode 6 of the second surface of the semiconductor substrate. In the semiconductor apparatus according to the present invention where the first electrode 3 and the second electrode 6 are connected by the conductive object, even though the contact hole 4 is tapered as illustrated in FIG. 2A or inclined as illustrated in FIG. 2B, the first and second electrodes function satisfactorily as the penetrating electrode. The sectional shape of the contact hole 4 in a direction parallel to the surface of the semiconductor substrate may be circular as illustrated in FIG. 3A, triangular as illustrated in FIG. 3B, or multi-angular as illustrated in FIG. 3C. In each of FIGS. 3A to 3C, the extended portion 6a is formed in a portion of the contact hole 4 in a circumferential direction.

Next, a method of manufacturing a semiconductor apparatus according to the present invention will be described using FIGS. 4A to 4F.

(Process of Forming a First Electrode in a First Surface of a Semiconductor Substrate at the Front Surface Side)

Figure 4A:
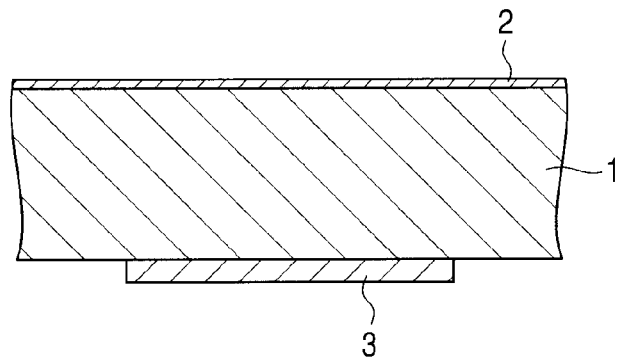
FIGS. 4A, 4B, 4C, 4D, 4E and 4F are process views illustrating processes of a method of manufacturing the semiconductor apparatus according to the first embodiment.

First, as illustrated in FIG. 4A, using the conventional semiconductor process, the first electrode 3 is formed on the first surface that is the front surface side of the semiconductor substrate 1. Preferably, aluminum, aluminum alloy or copper is used for the first electrode 3. In the semiconductor substrate 1, the passivation film 2 may be formed on the second surface that is the rear surface side of the semiconductor substrate 1.

(Process of Forming a Contact Hole)

Figure 4B:
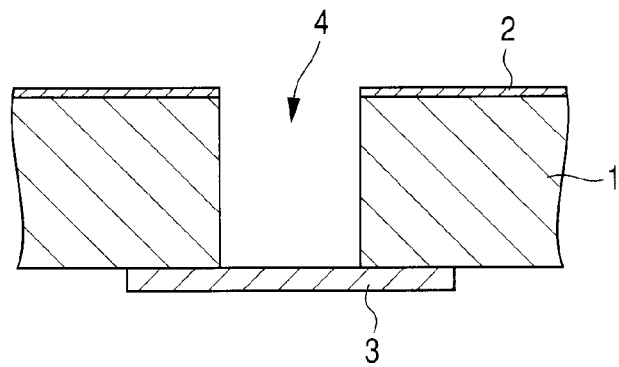
Figure 4C:
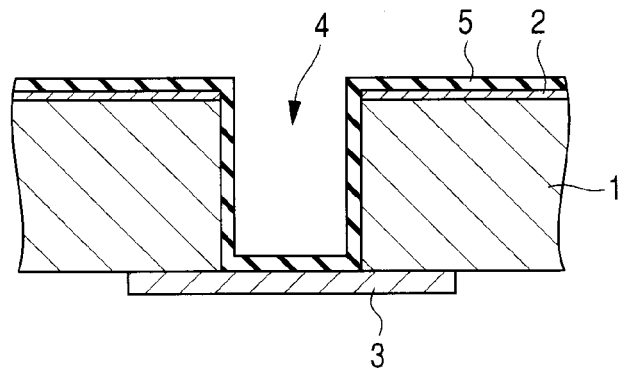
Figure 4D:
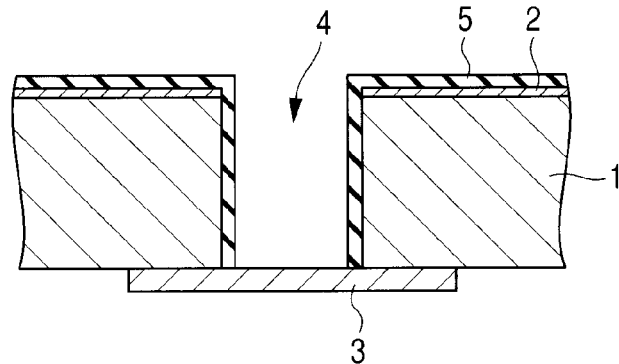

Next, as illustrated in FIG. 4B, the first electrode 3 is exposed to the bottom portion of the contact hole 4 by opening the contact hole 4, which penetrates the semiconductor substrate 1 from the side of the second surface at the position corresponding to the first electrode 3 formed on the first surface. Next, as illustrated in FIG. 4D, the insulating film 5 is formed on the second surface and the side of the contact hole 4. As illustrated in FIG. 4C, after the insulating film 5 is formed on the second surface, the side of the contact hole 4, and the surface of the first electrode 3 in the bottom portion of the contact hole 4, the insulating film 5 that is formed on the surface of the first electrode 3 may be removed, and the first electrode 3 may be exposed to the bottom portion of the contact hole 4 again.

(Process of Forming a Second Electrode, Having an Extended Portion Extending to the Inside of a Contact Hole, in a Second Surface of a Semiconductor Substrate, Using a Low-Temperature Process)

Figure 4E:
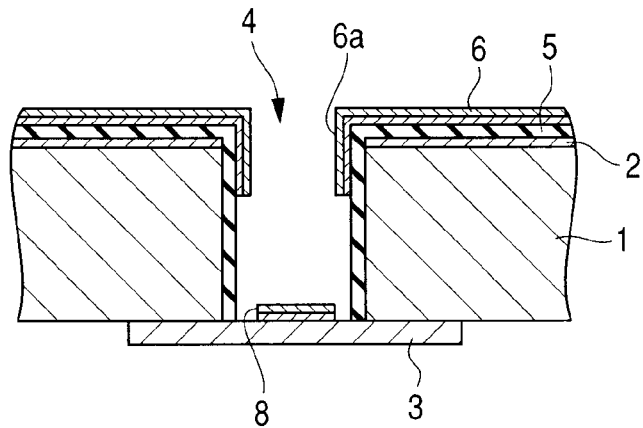

Next, as illustrated in FIG. 4E, the semiconductor substrate 1 is inclined at a desired angle during film formation, using a simple sputtering or ion coating method, and the second electrode 6 is formed using a metal film. That is, the metal film is formed by depositing metal particles using sputtering or ion coating method. An incident angle of the metal particle is 20° or more and 85° or less to the side of the contact hole 4. The metal particle preferably includes one of Ti, Au, TiN, Ni and tungsten. If the incident angle is less than 20°, it is difficult to form a dense film on the side of the contact hole 4, which raises the resistance value of the extended portion 6a and prevents the obtaining of a good conductivity. If the incident angle is more than 85°, the extended portion 6a is hardly formed on the side of the contact hole 4, and this tends to lead to a disconnection. Since the metal film is formed using the sputtering or ion coating method, the second electrode can be formed with a low-temperature process. Here, the term "low-temperature process" means that the second electrode is formed at a temperature of 200° C. or less. By inclining the semiconductor substrate 1 at the desired angle, the extended portion 6a that extends from the second surface of the rear surface side to the inside of the contact hole 4 can be formed. Preferably, the second electrode includes one of Ti, Au, TiN, Ni and tungsten. In addition, the second electrode 6 may be formed of metal films of plural layers or a metal film of a single layer. Further, in order to maintain the surface of the first electrode 3 at low resistance, reverse sputtering may be performed on the surface of the electrode, and the barrier seed layer 8 may be formed on the surface of the first electrode 3.

(Process of Filling a Conductive Object Connecting an Extended Portion of a Second Electrode and a First Electrode into a Contact Hole)

Figure 4F:
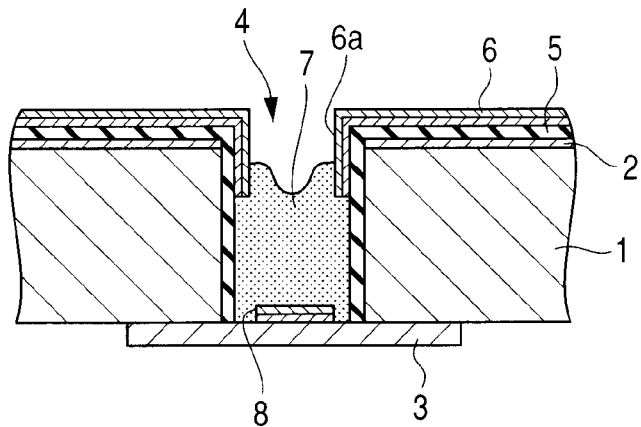
Figure 5:
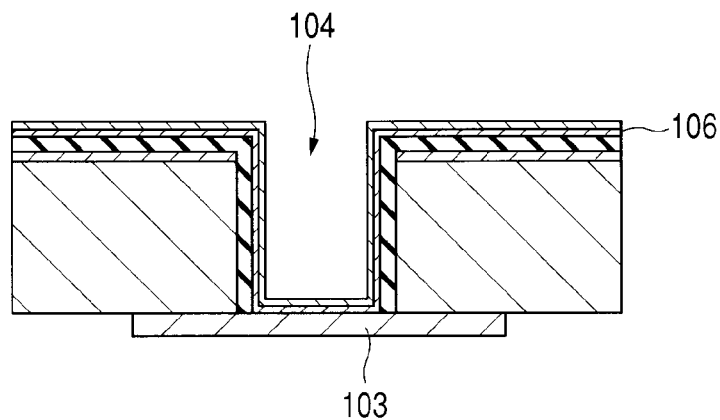
FIG. 5 is a perspective view illustrating a laminated structure of semiconductor chips.

Next, a conductive paste is filled into the contact hole 4 having the extended portion 6a of the second electrode 6, using a vacuum-pressure method or a dispensing method. Next, the conductive paste is dried and hardened. By drying and hardening the conductive paste at a temperature of about 120° C., metals in the conductive paste are bonded to each other, and the conductive object 7 is formed in the contact hole 4, as illustrated in FIG. 4F. Preferably, the conductive paste includes one of copper, silver and Ni. As a result, the first electrode 3 and the conductive object 7 are connected to each other, and the conductive object 7 and the extended portion 6a of the second electrode 6 are connected to each other. Thereby, the first electrode 3 and the second electrode 6 are electrically connected through the conductive object 7, thereby forming a penetrating electrode. As such, since the first electrode 3 and the extended portion 6a of the second electrode 6 are connected by the conductive object 7, a penetrating electrode having a high aspect ratio can be easily formed using the low-temperature process. Since the conductive object 7 is filled into the contact hole 4, the extended portion 6a of the second electrode 6 is not limited to the configuration of having a uniform thickness, as illustrated in FIG. 1A. Even if the thickness of the extended portion 6a is varied as illustrated in FIG. 1B, the contact hole 4 is tapered as illustrated in FIG. 2A, or the contact hole 4 inclined as illustrated in FIG. 2B, the penetrating electrode can be formed without its suitability being affected by the variation in thickness or the shape.

As illustrated in FIG. 1C, in the case where a barrier seed layer 8 does not need to be formed in the first electrode 3, the barrier seed layer 8 may not be formed.

In the actual manufacturing of the penetrating electrode, due to a variation in a perforating process, a notch may be generated in the contact hole 4, the contact hole may be tapered as illustrated in FIG. 2A, the contact hole may be inclined as illustrated in FIG. 2B, or a variation may be generated between wafers and in the wafers. For this reason, it is difficult to coat an inner wall of the contact hole including the bottom portion without causing a problem from a practical viewpoint, in order to stably and massively produce the penetrating electrode.

As a conventional method for solving the problem of the hole shape, the MO-CVD method that decomposes and deposits organic Cu and the like using a CVD is an effective method. However, since the deposition needs to be performed at a high process temperature of more than 200° C., this method cannot be applied to various semiconductor apparatuses that need to be protected from damage due to heat.

Meanwhile, according to the present invention, penetrating electrodes that have various hole shapes and a high aspect ratio can be formed with a low-temperature process.

As illustrated in FIG. 1D, the bump 10 can be formed, and the extended portion 6a of the second electrode 6 can be formed in just a portion of the contact hole 4 in a circumferential direction.

Further, the semiconductor substrate 1 may be a semiconductor substrate that uses a single element, such as silicon, germanium, and selenium, or a compound, such as oxide, sulfide, selenide, telluride, antimonial, arsenical, and a phosphorus compound, as an ingredient component.

First Embodiment

In this embodiment, a semiconductor apparatus having the configuration illustrated in FIG. 1A is manufactured.

First, a six-inch semiconductor substrate that is a semiconductor substrate manufactured made of silicon is prepared. In a surface of the semiconductor substrate 1, a first electrode 3, a semiconductor device (not illustrated), and a wiring are provided. In the surface of the semiconductor substrate 1, a passivation film 2 having the thickness of 0.1 µm is formed. The thickness of an electrode pad is 2.1 µm, and the thickness of the wiring is 0.6 µm. The passivation film 2 is formed by laminating layers of $SiO_2$ and SiN using a semiconductor process. The thickness of the semiconductor substrate 1 is 200 µm.

Next, a contact hole 4 of ϕ30 µm is formed in the semiconductor substrate 1 using ICP-RIE. At this time, the aspect ratio of the contact hole 4 is about 7.

Next, a silane coupling agent is coated using solution-immersion, and an insulating film 5 is formed using the CVD method. As a silane coupling process, using 0.1% of KBM-603 (product name, manufactured by Shin-Etsu Chemical Co., Ltd.) of a methanol solvent and the like, processes of liquid cutting, drying, washing, and drying of coupling are performed.

Next, a Parylene film is formed as the insulating film 5, and the insulating film of the bottom portion of the contact hole is removed by dry etching.

Next, a second electrode 6 having an extended portion 6a extending to the inside of a contact hole with a diameter of two times larger than a diameter of a hole is formed using a sputtering method or an ion coating method. The second electrode 6 can be formed at a temperature of about 100° C. A metal film that becomes the second electrode 6 is formed in a state where Ti is 1000 Å and Au is 4000 Å in a conversion of the film thickness of the surface.

Next, a conductive paste is filled into the contact hole 4 using a vacuum-pressure method. Next, the conductive paste is dried at a temperature of 120° C. and hardened. A conductive object 7 is formed by the hardening. As the conductive paste, nano-paste ink (product name, manufactured by Harima Chemicals, Inc.) is used.

Second Embodiment

Next, a second embodiment will be described.

In this embodiment, a semiconductor apparatus having the configuration illustrated FIG. 1D is manufactured.

First, a six-inch semiconductor substrate 1 that is a semiconductor substrate manufactured made of silicon is prepared. In a surface of the semiconductor substrate 1, a first electrode 3, a semiconductor device (not illustrated), and a wiring are previously provided. In the surface of the semiconductor substrate 1, a passivation film 2 having the thickness of 0.1 µm is formed. The thickness of an electrode pad is 2.1 µm, and the thickness of the wiring is 0.6 µm. The passivation film 2 is formed by laminating layers of $SiO_2$ and SiN using a semiconductor process. The thickness of the semiconductor substrate 1 is 200 µm.

Next, a contact hole 4 of φ25 µm is formed in the semiconductor substrate 1 using ICP-RIE. At this time, the aspect ratio of the contact hole 4 is about 8.

Next, a silane coupling agent is coated using solution-immersion, and an insulating film 5 is formed using the CVD method. As a silane coupling process, using 0.1% of KBM-603 (product name, manufactured by Shin-Etsu Chemical Co., Ltd.) of a methanol solvent, processes of liquid cutting, drying, washing, and drying of coupling are performed.

Next, a Parylene film is formed as the insulating film 5. The insulating film of the bottom portion of the contact hole is removed by dry etching.

Next, a second electrode 6 having an extended portion 6a extending to the inside of a contact hole with a diameter of two times larger than a diameter of a hole is formed using a sputtering method or an ion coating method. At this time, during the film formation, a rotation of the semiconductor substrate 1 is stopped, and the extended portion 6a of the second electrode 6 is formed in a portion of the contact hole 4 in a circumferential direction as illustrated in FIG. 1D. As a result, the thickness difference between the surface of the semiconductor substrate and the deposition film in the extended portion 6a in the contact hole is reduced to about ⅓.

A metal film that becomes the second electrode 6 is formed in a state where Ti is 1000 Å and Au is 9200 Å. Further, the metal film can be formed at a temperature of about 100° C.

In this embodiment, the sectional shape of the contact hole is a circular shape illustrated in FIG. 3A. However, the contact hole may be any one of various contact holes 4 that have multangular sections, such as a triangular shape illustrated in FIG. 3B or a hexagonal shape illustrated in FIG. 3C, in addition to the circular shape. In the contact holes that have the above shapes, the extended portion 6a of the second electrode 6 is formed by stopping a rotation, to adjust to the given configuration.

Next, patterning is performed using a dry film, and a bump 10 is formed by gold plating. The thickness of the bump is 5 µm.

Next, a conductive paste is filled into the contact hole 4 using a vacuum-pressure method. Next, the conductive paste is dried at a temperature of 120° C. and hardened. A conductive object 7 is formed by hardening. As the conductive paste, nano-paste ink is used.

The sample is experimentally produced without causing a problem even in a case where the order of the process of forming the bump and the process of forming the conductive object are interchanged to produce a sample.

While the present invention has been described with reference to exemplary embodiments, it is to be understood that the invention is not limited to the disclosed exemplary embodiments.

This application claims the benefit of Japanese Patent Application No. 2008-271010, filed Oct. 21, 2008, and Japanese Patent Application No. 2009-235385, filed Oct. 9, 2009, which are hereby incorporated by reference herein in their entirety.

The invention claimed is:

1. A semiconductor apparatus, comprising:
   a semiconductor substrate having a front surface and a rear surface;
   a first electrode provided on said front surface;
   a second electrode provided on said rear surface;
   a contact hole formed in said semiconductor substrate, penetrating said semiconductor substrate so as to connect said first electrode and said second electrode;
   an insulating film formed on a side of said contact hole; and
   a conductive member filled in said contact hole so as to connect to said first electrode,
   wherein said second electrode has an extended portion that extends from said rear surface, said extended portion being formed on a portion of said insulating film formed on the side of said contact hole, and said extended portion and said conductive member, which is filled in said contact hole so as to overlap with said extended portion, are connected, to connect electrically said first electrode and said second electrode.

2. The semiconductor apparatus of claim 1, wherein said second electrode comprises one of Ti, Au, TiN, Ni and tungsten.

3. The semiconductor apparatus of claim 1, wherein said conductive member comprises one of copper, silver and Ni.

4. A method of manufacturing a semiconductor apparatus, comprising:
   forming a first electrode on a front surface of a semiconductor substrate, which also has a rear surface;
   forming a contact hole in the semiconductor substrate to penetrate the semiconductor substrate from the front surface to the rear surface;
   forming an insulating film on a side of the contact hole;
   forming a second electrode, having an extended portion extending from the rear surface, on at rear surface side with a low-temperature process, the extended portion being formed on a portion of the insulating film formed on the side of the contact hole; and
   filling a conductive object in the contact hole, in the contact hole so as to overlap with the extended portion, so that the extended portion and the conductive object are connected, to connect electrically the first electrode and the second electrode.

5. A method of manufacturing a semiconductor apparatus according to claim 4, wherein the extended portion is formed by depositing metal particles using one of sputtering and ion coating method.

6. A method of manufacturing a semiconductor apparatus according to claim 5, wherein an incident angle of the metal particle in the sputtering and ion coating method is 20° or more and 85° or less to the side of the contact hole.

7. A method of manufacturing a semiconductor apparatus according to claim 4, wherein the metal particles comprise one of Ti, Au, TiN, Ni and tungsten.

8. A The semiconductor apparatus of claim 1, wherein said contact hole is tapered.

9. A The semiconductor apparatus of claim 1, wherein a sectional shape of said contact hole is one of a circular shape, a triangular shape and a multi-angular shape.

10. A The semiconductor apparatus of claim 1, wherein said extended portion is formed on a portion of said insulating film formed on the side of said contact hole in a circumferential direction.

11. The semiconductor apparatus of claim 1, wherein a barrier seed layer is formed on said first electrode.

* * * * *